US008987979B2

(12) United States Patent
Tamura

(10) Patent No.: US 8,987,979 B2
(45) Date of Patent: Mar. 24, 2015

(54) PIEZOELECTRIC VIBRATING PIECE, PIEZOELECTRIC VIBRATOR, OSCILLATOR, ELECTRONIC APPARATUS, AND RADIO-CONTROLLED TIMEPIECE

(71) Applicant: SII Crystal Technology Inc., Chiba-shi, Chiba (JP)

(72) Inventor: Masanori Tamura, Chiba (JP)

(73) Assignee: SII Crystal Technology Inc., Chiba (JP)

( * ) Notice: Subject to any disclaimer, the term of this patent is extended or adjusted under 35 U.S.C. 154(b) by 0 days.

(21) Appl. No.: 14/148,289

(22) Filed: Jan. 6, 2014

(65) Prior Publication Data

US 2014/0192625 A1 Jul. 10, 2014

(30) Foreign Application Priority Data

Jan. 10, 2013 (JP) ................................. 2013-002909

(51) Int. Cl.
| | | |
|---|---|---|
| H01L 41/08 | (2006.01) | |
| H03H 9/21 | (2006.01) | |
| H03B 5/36 | (2006.01) | |
| H03H 9/02 | (2006.01) | |
| G04R 20/08 | (2013.01) | |
| G04C 3/12 | (2006.01) | |
| G04C 3/00 | (2006.01) | |
| H03H 9/05 | (2006.01) | |
| H03H 9/10 | (2006.01) | |

(52) U.S. Cl.
CPC . *H03H 9/21* (2013.01); *H03B 5/36* (2013.01); *H03H 9/02157* (2013.01); *H03H 9/0519* (2013.01); *H03H 9/1021* (2013.01); *G04R 20/08* (2013.01); *G04C 3/12* (2013.01); *G04C 3/008* (2013.01)
USPC .......................................... 310/370; 310/344

(58) Field of Classification Search
CPC ........... H03H 9/19; H03H 9/21; H03H 9/215; B06B 1/0659; H03H 2003/026
USPC .............................. 310/370; 331/156; 333/200
See application file for complete search history.

(56) References Cited

U.S. PATENT DOCUMENTS

| | | | |
|---|---|---|---|
| 3,462,939 A * | 8/1969 | Kato et al. ..................... | 310/328 |
| 2011/0140795 A1* | 6/2011 | Yamaguchi et al. .......... | 331/158 |

FOREIGN PATENT DOCUMENTS

| | | |
|---|---|---|
| JP | 2006-345517 A | 12/2006 |
| JP | 2006-345519 A | 12/2006 |

\* cited by examiner

*Primary Examiner* — J. San Martin
(74) *Attorney, Agent, or Firm* — Brinks Gilson & Lione

(57) ABSTRACT

A piezoelectric vibrating piece includes a pair of vibrating arm portions which are arranged with a center axis interposed therebetween, a base portion which is arranged between a pair of vibrating arm portions and fixed to the outside, and a pair of connecting portions which connect proximal end portions of a pair of vibrating arm portions and a proximal end portion of the base portion. The distance between distal end portions of the vibrating arm portions and the center axis is smaller than the distance between the proximal end portions of the vibrating arm portions and the center axis.

10 Claims, 12 Drawing Sheets

PIEZOELECTRIC VIBRATING PIECE, PIEZOELECTRIC VIBRATOR, OSCILLATOR, ELECTRONIC APPARATUS, AND RADIO-CONTROLLED TIMEPIECE

RELATED APPLICATIONS

This application claims priority under 35 U.S.C. §119 to Japanese Patent Application No. 2013-002909 filed on Jan. 10, 2013, the entire content of which is hereby incorporated by reference.

BACKGROUND OF THE INVENTION

Field of the Invention

In the related art, a piezoelectric resonator which includes a piezoelectric vibrating piece having a pair of vibrating arm portions and a base portion, and the base portion provided between a pair of vibrating arm portions is fixed inside a package to accommodate the piezoelectric vibrating piece inside the package is known (see JP-A-2006-345517 and JP-A-2006-345519).

On the other hand, according to the related art, with reduction in size of the piezoelectric resonator, during vibration or when external impact is applied, the corner portion and the outer side surface of the distal end portions of a pair of vibrating arm portions come into contact with the inner side surface of the package, and cracks or defects are likely to occur in the distal end portions of the vibrating arm portions. If cracks or defects occur in the distal end portions of the vibrating arm portions, impact resistance and reliability of the piezoelectric vibrating piece are degraded.

SUMMARY OF THE INVENTION

Accordingly, the invention has been accomplished in consideration of the above-described situation, and an object of the invention is to provide a piezoelectric vibrating piece, a piezoelectric vibrator, an oscillator, an electronic apparatus, and a radio-controlled timepiece capable of avoiding the distal end portions of a pair of vibrating arm portions from coming into contact with the inner side surface of the package, achieving reduction in size, and improving impact resistance and reliability.

In order to solve the above-described problem and to attain the related object, according to a first aspect of the invention, there is provided a piezoelectric vibrating piece including a pair of vibrating arm portions, a base portion which is provided between a pair of vibrating arm portions, and connecting portions which connect proximal end portions of a pair of vibrating arm portions and a proximal end portion of the base portion. The vibrating arm portions are provided so as to be inclined toward the base portion side.

According to a second aspect of the invention, in the piezoelectric vibrating piece, the intersection angle of the vibrating arm portions and the connecting portions is smaller than 90 degrees, such that the vibrating arm portions are provided so as to be inclined toward the base portion side.

According to a third aspect of the invention, in the piezoelectric vibrating piece, the intersection angle of the base portion and the connecting portions is smaller than 90 degrees, such that the vibrating arm portions are provided so as to be inclined toward the base portion side.

According to a fourth aspect of the invention, in the piezoelectric vibrating piece, each of the connecting portions has at least one bent portion.

According to a fifth aspect of the invention, in the piezoelectric vibrating piece, the distal end portion of the base portion has a chamfered shape.

According to a sixth aspect of the invention, there is a piezoelectric vibrator including the above-described piezoelectric vibrating piece sealed airtight in a package. In the base portion, the piezoelectric vibrating piece is mounted in the package.

According to a seventh aspect of the invention, there is provided an oscillator including the above-described piezoelectric vibrator. The piezoelectric vibrator is electrically connected to an integrated circuit as an oscillating piece.

According to an eighth aspect of the invention, there is provided an electronic apparatus including the above-described piezoelectric vibrator. The piezoelectric vibrator is electrically connected to a counter unit.

According to a ninth aspect of the invention, there is provided a radio-controlled timepiece including the above-described piezoelectric vibrator. The piezoelectric vibrator is electrically connected to a filter unit.

According to the piezoelectric vibrating piece of the invention, since a pair of vibrating arm portions are provided so as to be inclined toward the base portion side, in the distal end portion of each vibrating arm portion, it is possible to expand the interval (clearance) between the outer side surface of the distal end portion and the inner side surface of the package. Accordingly, during vibration, when external impact is applied, or the like, it is possible to avoid the occurrence of cracks or defects in the distal end portion of the vibrating arm portion since the distal end portion of the vibrating arm portion comes into contact with the inner side surface of the package. Therefore, it is possible to attain reduction in size of the piezoelectric vibrating piece and to improve impact resistance and reliability.

In particular, in a hammerhead type piezoelectric vibrating piece in which the distal end portion is expanded in width, the interval between the distal end portion and the inner side surface of the package is likely to be narrowed. Meanwhile, according to the invention, it becomes possible to expand the interval.

If the distal end portion of the base portion has a chamfered shape, it becomes possible to prevent interference between the base portion and the vibrating arm portions.

According to the piezoelectric vibrator, the oscillator, the electronic apparatus, and the radio-controlled timepiece of the invention, it is possible to improve operation reliability.

DETAILED DESCRIPTION OF THE PREFERRED EMBODIMENTS

Figure 1:
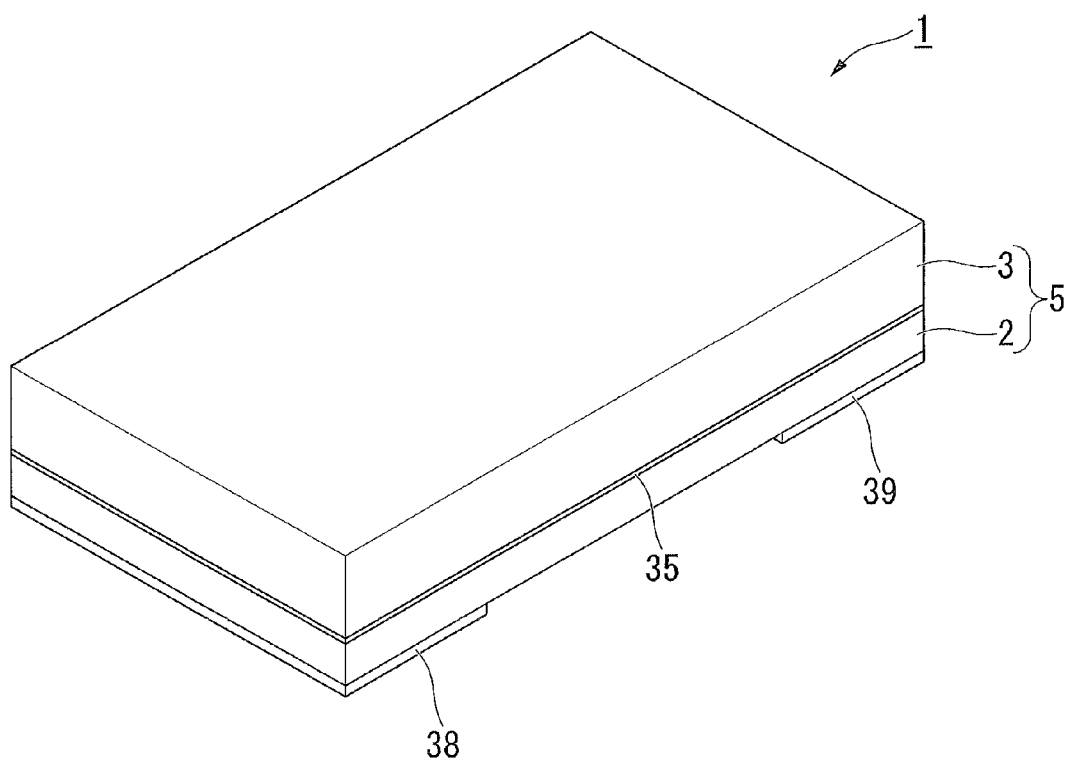
FIG. 1 is an appearance perspective view of a piezoelectric vibrator according to an embodiment of the invention.
Figure 2:
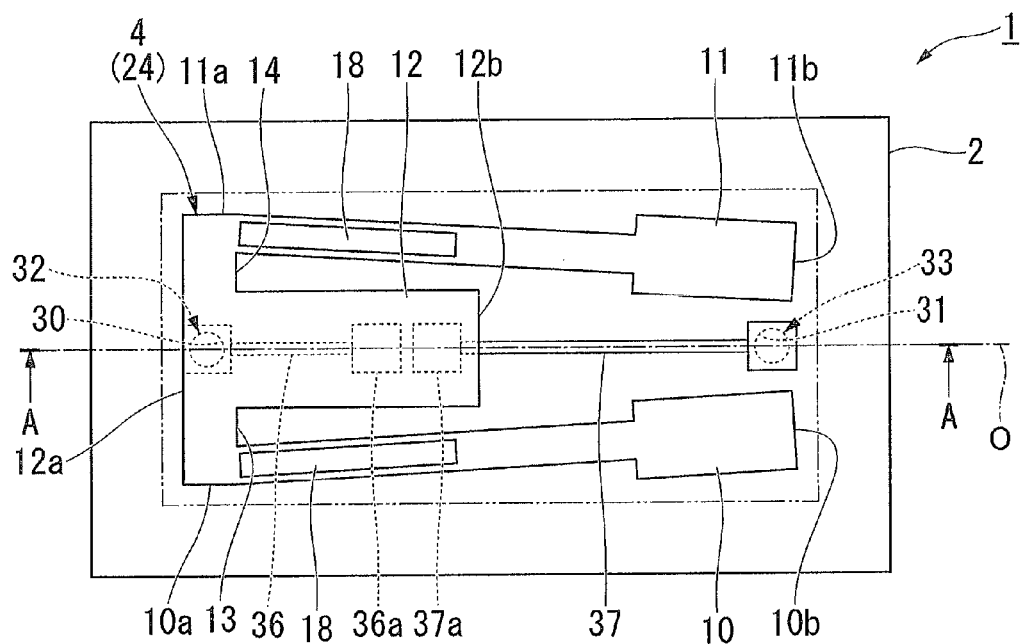
FIG. 2 is an internal configuration diagram of the piezoelectric vibrator shown in FIG. 1.

Hereinafter, a piezoelectric vibrating piece, a piezoelectric vibrator, an oscillator, an electronic apparatus, and a radio-controlled timepiece according to an embodiment of the invention will be described.

For example, as shown in FIGS. 1 to 4, a piezoelectric vibrator 1 of this embodiment is a surface mounting type piezoelectric vibrator 1 which includes a boxlike package 5 having a base substrate 2 and a lead substrate 3 anode-bonded through a bonding material 35, a piezoelectric vibrating piece 4 accommodated in a cavity C sealed inside the package 5.

The piezoelectric vibrating piece 4 and external electrodes 38 and 39 provided on the base substrate 2 are electrically connected by a pair of through electrodes 32 and 33 passing through the base substrate 2.

Figure 5:
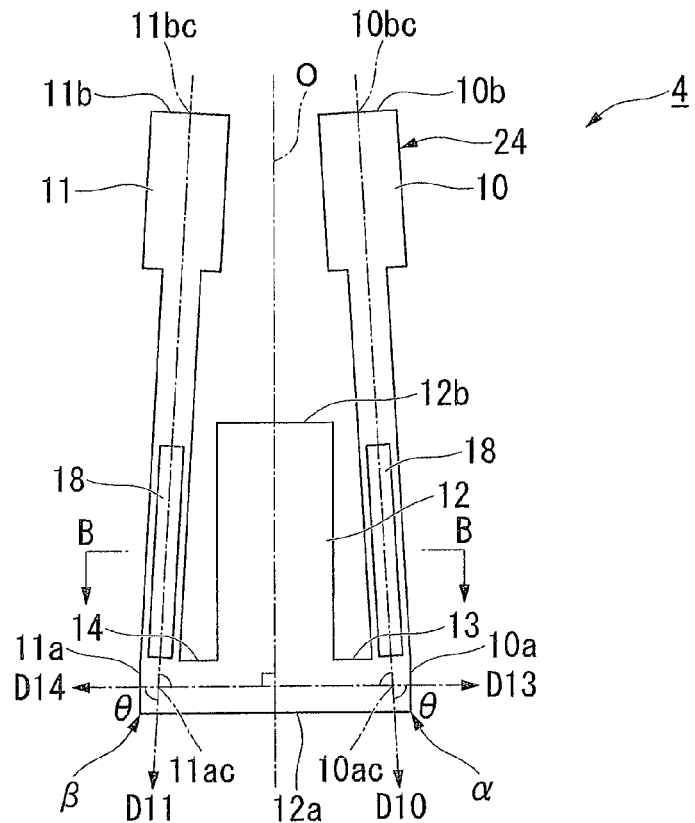
FIG. 5 is a plan view of a piezoelectric vibrating piece.
Figure 6:
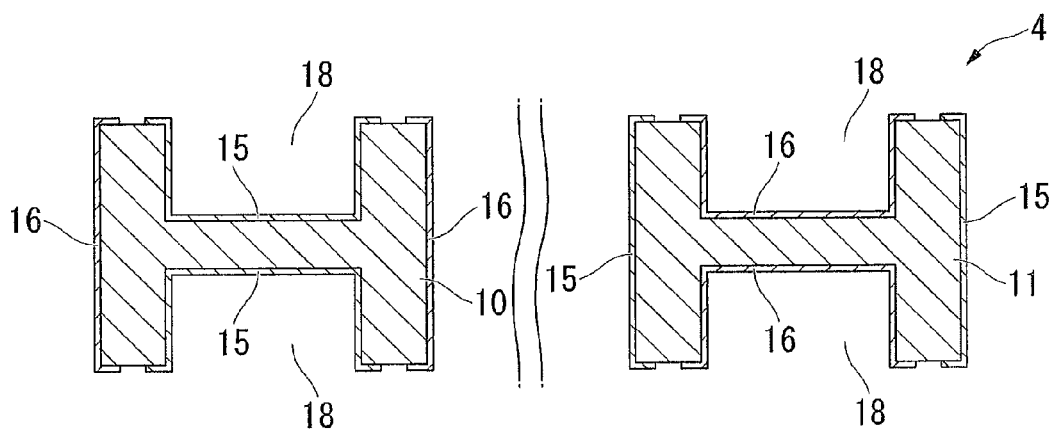
FIG. 6 is a diagram showing a cross section taken along the line B-B of FIG. 5.

For example, as shown in FIGS. 5 and 6, the piezoelectric vibrating piece 4 includes a tuning fork type piezoelectric plate 24 formed of a piezoelectric material, such as crystal, lithium tantalate or lithium niobate, and vibrates by the application of a predetermined voltage.

The piezoelectric plate 24 includes a pair of vibrating arm portions 10 and 11 which are arranged with a center axis O interposed therebetween, a base portion 12 which is arranged between a pair of vibrating arm portions 10 and 11 and fixed to the outside, and a pair of connecting portions 13 and 14 which connect proximal end portions 10a and 11a of a pair of vibrating arm portions 10 and 11 and a proximal end portion 12a of the base portion 12. The dimension in the length direction of each of the vibrating arm portions 10 and 11 is set to be equal to or greater than two times the interval between the vibrating arm portions 10 and 11 (the interval between the vibrating arm portions 10 and 11 in the proximal end portions 10a and 11a).

A pair of vibrating arm portions 10 and 11 are of a hammerhead type in which the width of each of the distal end portions 10b and 11b is expanded compared to the width of each of the proximal end portions 10a and 11a, thereby increasing the weight and moment of inertia during vibration of the distal end portions 10b and 11b of the vibrating arm portions 10 and 11. Accordingly, the vibrating arm portions 10 and 11 easily vibrate, thereby reducing the length of the vibrating arm portions 10 and 11 and achieving reduction in size. Although the hammerhead type vibrating arm portions 10 and 11 have been described, a piezoelectric vibrating piece to which the invention can be applied is not limited to the hammerhead type. That is, a piezoelectric vibrating piece in which the width of the distal end portions 10b and 11b is substantially equal to the width of the proximal end portions 10a and 11a, or a piezoelectric vibrating piece in which the distal end portions 10b and 11b are tapered compared to the proximal end portions may be used.

This embodiment is characterized in that the distance between each of the distal end portions 10b and 11b of the vibrating arm portions 10 and 11 and the center axis O is smaller than the distance between each of the proximal end portions 10a and 11a of the vibrating arm portions 10 and 11 and the center axis O.

Specifically, the vibrating arm portions 10 and 11 are extended so as to be inclined toward the base portion side. Accordingly, in the width direction of the piezoelectric vibrating piece 4, it is possible to expand the clearance (not shown) between the outer side of each of the distal end portions 10b and 11b of the vibrating arm portions 10 and 11 and the inner side (not shown) of PKG.

A pair of vibrating arm portions 10 and 11 are formed such that, in connections α and β to a pair of connecting portions 13 and 14, the intersection angle θ of directions D10 and D11 from the distal end portions 10b and 11b toward the proximal end portions 10a and 11a and directions D13 and D14 in which the connecting portions 13 and 14 extend from the proximal end portion 12a of the base portion 12 becomes an acute angle smaller than 90°.

If the intersection angle θ is equal to or greater than 87° and equal to or smaller than 90°, it is preferable from the viewpoint of electrical characteristics that changes in frequency, RI (equivalent input resistance), and CI (equivalent input capacitance) are within a predetermined allowable range. If the intersection angle θ is excessively small, since the distal end portions 10b and 11b of the vibrating arm portions 10 and 11 may interfere with each other during vibration, it is preferable from the viewpoint of physical characteristics that the intersection angle is within the above-described range. However, the inventors have found that, as a result of a simulation, when the length of each of the vibrating arm portions 10 and 11 is equal to or greater than two times the interval of the vibrating arm portions 10 and 11 and when there is no margin in the distal end portions 10b and 11b, even if the intersection angle θ decreases to about 85°, it becomes easy to avoid the interference of the distal end portions 10b and 11b.

For example, the distance Lb between the distal end portion 12b of the base portion 12 and each of the vibrating arm portions 10 and 11 with respect to the dimension La (for example, 60 μm or the like) in the width direction of each of the vibrating arm portions 10 and 11 is set to a value according to the dimension La (for example, 40 to 50 μm or the like) in the width direction of each of the vibrating arm portions 10 and 11.

A pair of vibrating arm portions 10 and 11 are configured such that excitation electrodes having a first excitation electrode 15 and a second excitation electrode 16 which vibrate a pair of vibrating arm portions 10 and 11 are provided on the surface of a piezoelectric body (piezoelectric plate 24) made of a piezoelectric material.

The base portion 12 is configured such that a pair of mounting electrodes (not shown) which electrically connect the first excitation electrode 15 and the second excitation electrode 16 to lead-out electrodes 36 and 37 are provided on the surface of the piezoelectric body (piezoelectric plate 24) made of a piezoelectric material.

The piezoelectric plate 24 includes groove portions 18 which are formed on both principal surfaces of a pair of vibrating arm portions 10 and 11 in the longitudinal direction (extension direction) of the vibrating arm portions 10 and 11. For example, each of the groove portions 18 is substantially formed from the proximal end of corresponding one of the vibrating arm portions 10 and 11 to near the center. Although a form in which the groove portions 18 are provided in the vibrating arm portions 10 and 11 has been described, the invention can be applied to a piezoelectric vibrating piece in which no groove portions 18 are provided in the vibrating arm portions 10 and 11.

The excitation electrodes having the first excitation electrode 15 and the second excitation electrode 16 are patterned on the outer surfaces of a pair of vibrating arm portions 10 and 11 in a state of being electrically insulated from each other, and cause a pair of vibrating arm portions 10 and 11 to vibrate at a predetermined frequency in a direction close to each other or away from each other.

Specifically, for example, the first excitation electrode 15 is primarily provided on the groove portion 18 of the first vibrating arm portion 10 and both side surfaces of the second vibrating arm portion 11.

The second excitation electrode 16 is primarily provided on both side surfaces of the first vibrating arm portion 10 and the groove portion 18 of the second vibrating arm portion 11.

The first excitation electrode 15 and the second excitation electrode 16 are electrically connected to the mounting electrodes (not shown) through the lead-out electrodes (not shown) on both principal surfaces of the base portion 12.

Accordingly, a voltage is applied to the piezoelectric vibrating piece 4 through the mounting electrodes (not shown).

A pair of vibrating arm portions 10 and 11 include weight metal films (not shown) coated on the outer surfaces for frequency adjustment to adjust the vibration state such that the vibrating arm portions 10 and 11 vibrate within a range of a predetermined frequency.

The weight metal films (not shown) include, for example, a coarse adjustment film (not shown) for coarsely adjusting the frequency and a fine adjustment film (not shown) for finely adjusting the frequency.

The frequency adjustment is performed by the weight adjustment of the coarse adjustment film and the fine adjustment film, and the frequency of each of a pair of vibrating arm portions 10 and 11 is adjusted so as to fall within a range of a predetermined target frequency.

Figure 3:
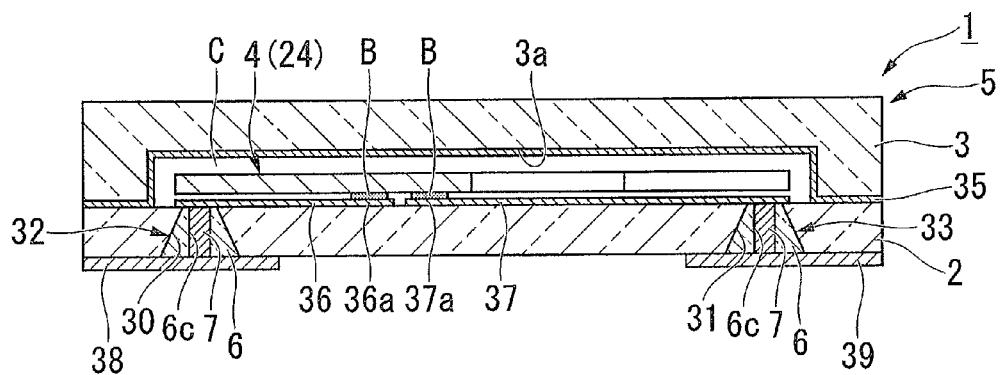
FIG. 3 is a sectional view of the piezoelectric vibrator taken along the line A-A of FIG. 2.
Figure 4:
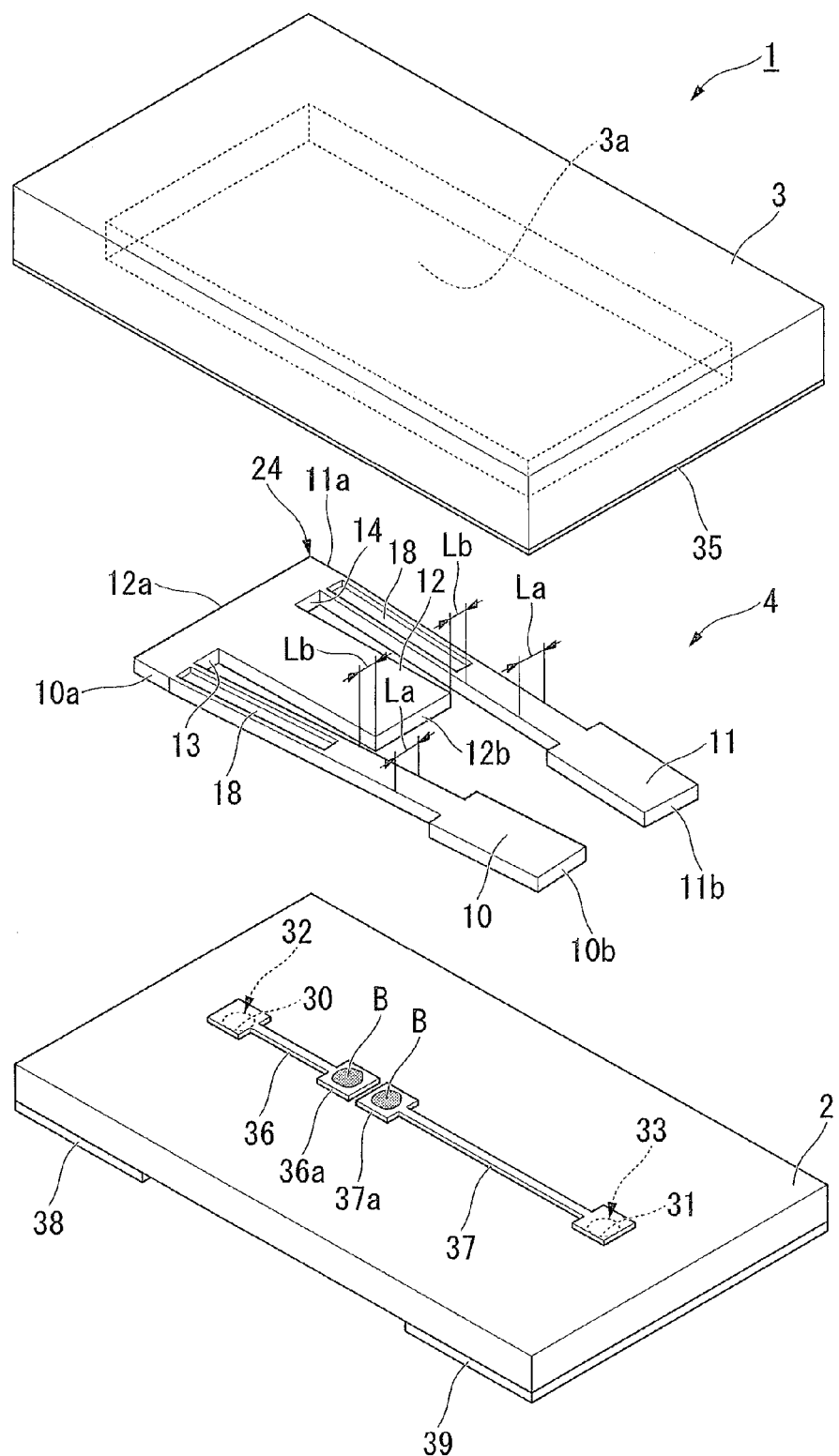
FIG. 4 is an exploded perspective view schematically showing the piezoelectric vibrator shown in FIG. 1.

For example, as shown in FIGS. 3 and 4, the piezoelectric vibrating piece 4 is bump-bonded onto the lead-out electrodes 36 and 37 provided on the surface (the surface facing the lead substrate 3) of the base substrate 2 by a bump B, such as gold.

Specifically, the first excitation electrode 15 of the piezoelectric vibrating piece 4 is bump-bonded onto the second lead-out electrode 37 through the first mounting electrode (not shown) and the bump B, and the second excitation electrode 16 is bump-bonded onto the first lead-out electrode 36 through the second mounting electrode (not shown) and the bump B.

Accordingly, the piezoelectric vibrating piece 4 is supported in a state of being floated from the surface (the surface facing the lead substrate 3) of the base substrate 2, and the mounting electrodes (not shown) and the lead-out electrodes 36 and 37 are electrically connected together.

The lead substrate 3 is formed in a plate shape using a transparent insulating substrate made of a glass material, such as soda-lime glass. On the bonding surface which is bonded to the base substrate 2, a rectangular concave portion 3a in which the piezoelectric vibrating piece 4 can be accommodated is provided.

The concave portion 3a forms a cavity C, in which the piezoelectric vibrating piece 4 is accommodated, along with the surface (the surface facing the lead substrate 3) of the base substrate 2, when both substrates 2 and 3 are superimposed.

The lead substrate 3 includes a bonding material 35 which is provided on the entire surface facing the base substrate 2. For example, the bonding material 35 is provided on the bonding surface to the base substrate 2 and the entire inner surface of the concave portion 3a. The lead substrate 3 is anode-bonded to the base substrate 2 through the bonding material 35 in a state where the concave portion 3a faces the base substrate 2, and seals the cavity C airtight.

Similarly to the lead substrate 3, the base substrate 2 is formed in a plate shape to be superimposed on the lead substrate 3 using a transparent insulating substrate made of a glass material, such as soda-lime glass. The base substrate 2 includes a pair of through holes 30 and 31 which pass therethrough in the thickness direction and are formed inside the cavity C.

Specifically, for example, of the through holes 30 and 31 of this embodiment, the first through hole 30 is formed at a position facing the proximal end portion 12a of the base portion 12 of the mounted piezoelectric vibrating piece 4. The second through hole 31 is formed at a position facing between the distal end portions 10b and 11b of the vibrating arm portions 10 and 11. The through holes 30 and 31 are formed to have a tapered cross section in which the diameter is gradually reduced from a first surface toward a second surface (a surface facing the lead substrate 3) of the base substrate 2.

In this embodiment, although the through holes 30 and 31 are formed to have a tapered cross section, the invention is not limited thereto. For example, a through hole which passes through the base substrate 2 in the thickness direction at the same diameter may be provided, and in summary, it should suffice that a through hole passes through the base substrate 2.

A pair of through holes 30 and 31 include a pair of through electrodes 32 and 33 which are formed so as to fill the through holes 30 and 31. The through electrodes 32 and 33 are formed by a cylinder 6 and a core portion 7 integrally fixed to the through holes 30 and 31 by sintering, close the through holes 30 and 31 so as to maintain airtightness inside the cavity C, and provide electrical conduction between external electrodes 38 and 39 and the lead-out electrodes 36 and 37.

Specifically, for example, the first through electrode 32 is arranged facing the lead-out electrode 36 between the external electrode 38 and the base portion 12, and the second through electrode 33 is arranged facing the lead-out electrode 37 between the external electrode 39 and the distal end portions 10b and 11b of the vibrating arm portions 10 and 11.

The cylinder 6 is formed by sintering paste-like glass frit.

Specifically, for example, the cylinder 6 is formed in a cylindrical shape having both flat ends and the substantially same thickness as the base substrate 2. The cylinder 6 fixes the core portion 7 which is inserted into a center hole passing through the cylinder 6 in the thickness direction.

In this embodiment, the profile of the cylinder 6 is formed to have a conical shape (tapered cross section) in conformity with the shape of corresponding one of the through holes 30 and 31. The cylinder 6 is sintered in a state of being filled inside corresponding one of the through holes 30 and 31, and firmly fixed to corresponding one of the through holes 30 and 31.

The core portion 7 is a conductive core which is formed in a columnar shape using a metal material, and similarly to the cylinder 6, has both flat ends and the substantially same thickness as the base substrate 2.

The core portion 7 is located at a center hole 6c of the cylinder 6 and firmly fixed to the cylinder 6 by sintering the cylinder 6. Each of the through electrodes 32 and 33 has electrical conductivity by the conductive core portion 7.

The base substrate 2 is configured such that a pair of lead-out electrodes 36 and 37 patterned by a conductive material (for example, aluminum) are provided on the surface on the bonding surface side to which the lead substrate 3 is bonded. A pair of lead-out electrodes 36 and 37 are electrically connected to the first through electrode 32 of a pair of through electrodes 32 and 33 and the second mounting electrode (not shown) of the piezoelectric vibrating piece 4, and is electrically connected to the second through electrode 33 and the first mounting electrode (not shown) of the piezoelectric vibrating piece 4.

Specifically, for example, the first lead-out electrode 36 is provided so as to extend from the first through electrode 32 arranged in the proximal end portion 12a of the base portion 12 toward a support portion 36a arranged in the distal end portion 12b of the base portion 12 in the axial direction of the center axis O.

The first lead-out electrode 36 supports the distal end portion 12b of the base portion 12 by bump-bonding using the bump B of the support portion 36a in a state of being floated from the surface (the surface facing the lead substrate 3) of the base substrate 2, and is electrically connected to the second mounting electrode (not shown) of the piezoelectric vibrating piece 4.

The second lead-out electrode 37 is provided so as to extend from the second through electrode 33 arranged at a position between the distal end portions 10b and 11b of a pair of vibrating arm portions 10 and 11 toward a support portion 37a arranged in the distal end portion 12b of the base portion 12 in the axial direction of the center axis O.

The second lead-out electrode 37 supports the distal end portion 12b of the base portion 12 by bump-bonding using the bump B of the support portion 37a in a state of being floated from the surface (the surface facing the lead substrate 3) of the base substrate 2, and is electrically connected to the first mounting electrode (not shown) of the piezoelectric vibrating piece 4.

Accordingly, the second mounting electrode (not shown) of the piezoelectric vibrating piece 4 is provided electrical conduction to the first through electrode 32 through the first lead-out electrode 36. The first mounting electrode (not shown) is provided electrical conduction to the second through electrode 33 through the second lead-out electrode 37.

The base substrate 2 is configured such that the external electrodes 38 and 39 which are electrically connected to a pair of through electrodes 32 and 33 are provided on the first surface.

The first external electrode 38 is electrically connected to the second excitation electrode 16 of the piezoelectric vibrating piece 4 through the first through electrode 32 and the first lead-out electrode 36.

The second external electrode 39 is electrically connected to the first excitation electrode 15 of the piezoelectric vibrating piece 4 through the second through electrode 33 and the second lead-out electrode 37.

The piezoelectric vibrator 1 is activated when a predetermined driving voltage is applied to the external electrodes 38 and 39 formed on the base substrate 2, and a current flows in the excitation electrodes having the first excitation electrode 15 and the second excitation electrode 16 of the piezoelectric vibrating piece 4, thereby causing a pair of vibrating arm portions 10 and 11 to vibrate at a predetermined frequency in a direction close to each other or away from each other.

The vibration of a pair of vibrating arm portions 10 and 11 is used as a time source, a timing source of a control signal, a reference signal source, or the like.

As described above, according to the piezoelectric vibrating piece 4 of this embodiment, since a pair of vibrating arm portions 10 and 11 extend from the connecting portions 13 and 14 so as to be inclined toward the base portion 12 side, in particular, in the distal end portions 10b and 11b of the vibrating arm portions 10 and 11, it is possible to expand the interval between the outer side surface of each of the distal end portions 10b and 11b and the inner side surface of the package 5. Accordingly, during vibration or when external impact is applied, it is possible to reduce a possibility that the distal end portions of the vibrating arm portions 10 and 11 come into contact with the inner side surface of the package 5 to cause cracks or defects in the distal end portions 10b and 11b, and to significantly improve reliability of the piezoelectric vibrating piece 4. In particular, as in this embodiment, in the hammerhead type piezoelectric vibrating piece 4, while the distal end portions 10b and 11b are likely to come into contact with the inner side surface of the package 5, according to this embodiment, it becomes possible to avoid this problem. Accordingly, it is possible to attain reduction in size of the piezoelectric vibrator 1 and to improve impact resistance and reliability. There is a significant feature in that, when the angel when the vibrating arm portions 10 and 11 are inclined, specifically, the intersection angle of the vibrating arm portions 10 and 11 and the connecting portions 13 and 14 is equal to or greater than 87° and smaller than 90° (in a case of not a hammer type, equal to or greater than 85° and smaller than 90°), it is found that electrical characteristics and physical characteristics are further improved.

First Modification, Piezoelectric Vibrating Piece

Figure 7:
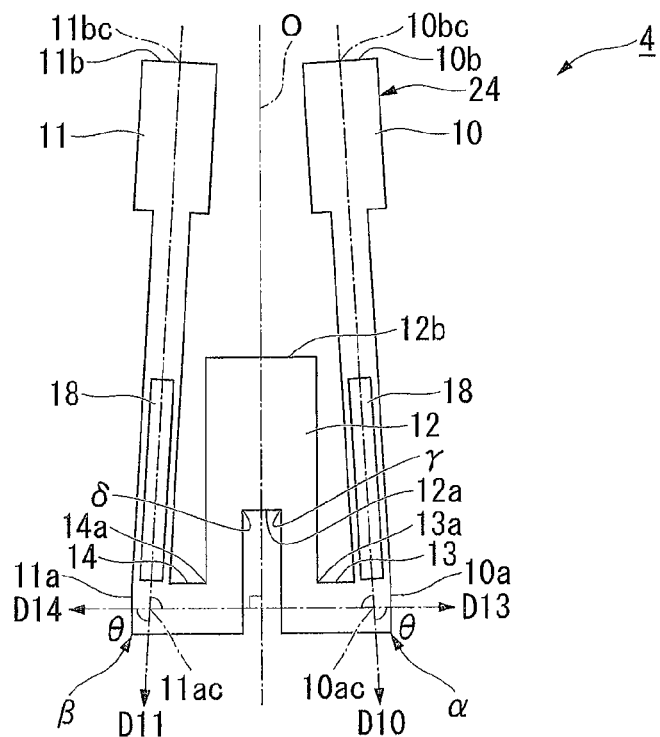
FIG. 7 is a plan view of a piezoelectric vibrating piece according to a first modification of the embodiment of the invention.

In the above-described embodiment, although the shape of a pair of connecting portions 13 and 14 is substantially a linear shape, the shape of the connecting portions 13 and 14 is not limited thereto, and as shown in FIG. 7, each of the connecting portions 13 and 14 may include at least one bent portion 13a or 14a. That is, as shown in FIG. 7, the connecting portions 13 and 14 may substantially have an L shape.

Even with this shape, the vibrating arm portions 10 and 11 which extend from the connecting portions 13 and 14 are formed so as to be inclined toward the base portion 12 side, thereby obtaining the same effects as described above. The connecting portions 13 and 14 have a bent shape, whereby it is possible to extend the length from the vibrating arm portions 10 and 11 to the mounting electrodes of the base portion 12. For this reason, the vibration of the vibrating arm portions 10 and 11 is easily attenuated, making it possible to reduce "vibration leakage" when the vibration of the vibrating arm portions 10 and 11 propagates toward the package 5 side.

Although the shape of the connecting portions 13 and 14 substantially have an L shape, the shape of the connecting portions 13 and 14 is not limited thereto.

As shown in the drawing, a pair of vibrating arm portions 10 and 11 are formed such that in the connections α and β to a pair of connecting portions 13 and 14, the intersection angle θ of the directions D10 and D11 from the distal end portions 10b and 11b toward the proximal end portions 10a and 11a and the directions D13 and D14 in which the connecting portions 13 and 14 extend from the bent portions 13a and 14a is an acute angle smaller than 90° by a predetermined angle.

The width of the connecting portions 13 and 14 is substantially equal to or about 1.2 times the width of the vibrating arm portions 10 and 11.

Second Modification, Piezoelectric Vibrating Piece

A piezoelectric vibrating piece 4 according to a second modification of the above-described embodiment will be described.

Figure 8:
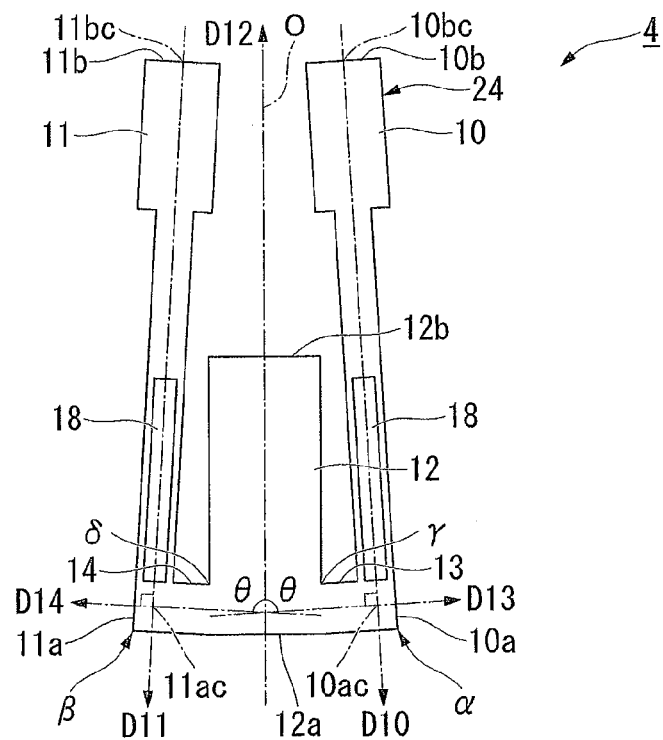
FIG. 8 is a plan view of a piezoelectric vibrating piece according to a second modification of the embodiment of the invention.

As shown in FIG. 8, in the piezoelectric vibrating piece 4 according to the second modification, the vibrating arm portions 10 and 11 are formed so as to be inclined toward the base portion 12 side.

Specifically, the base portion 12 is formed such that the direction D12 from the proximal end portion 12a toward the distal end portion 12b is substantially parallel to the axial direction of the center axis O of the piezoelectric vibrating piece 4. A pair of connecting portions 13 and 14 are formed such that, in connections γ and δ to the proximal end portion 12a of the base portion 12, the intersection angle θ of directions D13 and D14 in which the connecting portions 13 and 14 extend from the proximal end portion 12a of the base portion 12 and a direction D12 from the proximal end portion 12a of the base portion 12 toward the distal end portion 12b is an acute angle smaller than 90°. That is, in the second modification, the intersection angle of the base portion 12 and the connecting portions 13 and 14 is smaller than 90 degrees, whereby the vibrating arm portions 10 and 11 are provided so as to be inclined toward the base portion 12 side. As described above, if the intersection angle is equal to or greater than 87° and smaller than 90° (in a case of not a hammer type, equal to or greater than 85° and smaller than 90°), electrical characteristics and physical characteristics are further improved. In this modification, since the intersection angle of the connecting portions 13 and 14 and the vibrating arm portions 10 and 11 is substantially set to 90°, it is possible to obtain excellent vibration characteristics (as to the base of the vibrating arm portion, a pattern extending orthogonally from the connecting portion holding the connecting portion is most suitable from the viewpoint of vibration characteristics), compared to a case where the intersection angle of the connecting portions 13 and 14 and the vibrating arm portions 10 and 11 is set to an acute angle.

A pair of vibrating arm portions 10 and 11 are formed such that, in the connections α and β to a pair of connecting portions 13 and 14, the directions D10 and D11 from the distal end portions 10b and 11b toward the proximal end portions 10a and 11a are orthogonal to the directions D13 and D14 in which the connecting portions 13 and 14 extend from the proximal end portion 12a of the base portion 12.

Third Modification, Piezoelectric Vibrating Piece

Figure 9:
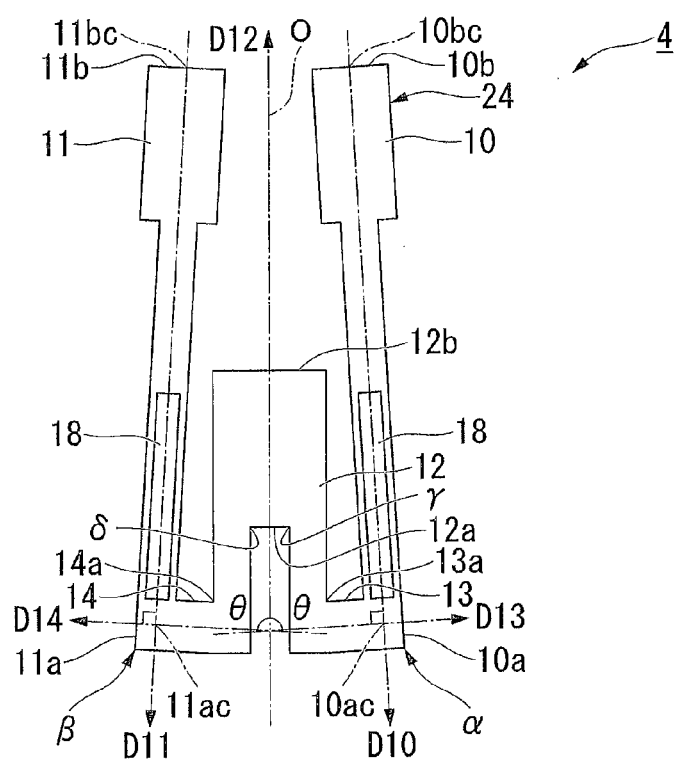
FIG. 9 is a plan view of a piezoelectric vibrating piece according to a third modification of the embodiment of the invention.

In the above-described second modification, a pair of connecting portions 13 and 14 extend from the proximal end portion 12a of the base portion 12 in a direction of intersecting at the intersection angle θ in the axial direction of the center axis O, the invention is not limited thereto, and for example, as in a third modification shown in FIG. 9, a pair of connecting portions 13 and 14 may include the above-described bent portions 13a and 14a.

Even with this shape, if the vibrating arm portions 10 and 11 are provided so as to be inclined toward the base portion 12 side, it is possible to obtain the same effects as described above.

Specifically, the base portion 12 is formed such that the direction D12 from the proximal end portion 12a toward the distal end portion 12b is parallel to the axial direction of the center axis O. A pair of connecting portions 13 and 14 extend from the proximal end portion 12a of the base portion 12 in the axial direction of the center axis O in the connections γ and δ to the proximal end portion 12a of the base portion 12. The bent portions 13a and 14a are formed so as to be bent in the directions D13 and D14 of intersecting at the intersection angle θ (bending angle θ) smaller than 90° with respect to the direction D12 from the proximal end portion 12a of the base portion 12 toward the distal end portion 12b.

A pair of vibrating arm portions 10 and 11 are formed such that, in the connections α and β to a pair of connecting portions 13 and 14, the directions D10 and D11 from the distal end portions 10b and 11b toward the proximal end portions 10a and 11a are orthogonal to the directions D13 and D14 in which the connecting portions 13 and 14 extend from the bent portions 13a and 14a.

According to the third modification, the base portion 12 decreases in the axial direction of the center axis O by an amount corresponding to a portion of each of a pair of connecting portions 13 and 14 extending in the axial direction, whereby it is possible to extend the length of a pair of connecting portions 13 and 14 without changing the overall size of the piezoelectric vibrating piece 4.

Accordingly, it is possible to reduce the size of the piezoelectric vibrating piece 4 for a desired frequency.

Fourth Modification, Piezoelectric Vibrating Piece

A piezoelectric vibrating piece 4 according to a fourth modification of the above-described embodiment will be described.

Figure 10:
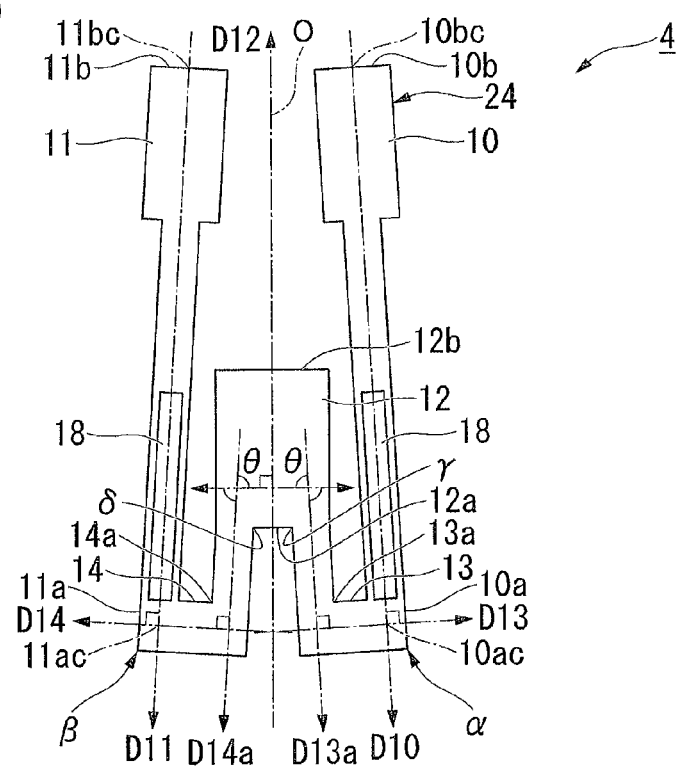
FIG. 10 is a plan view of a piezoelectric vibrating piece according to a fourth modification of the embodiment of the invention.

As shown in FIG. 10, in the piezoelectric vibrating piece 4 according to the fourth modification, the vibrating arm portions 10 and 11 are formed so as to be inclined toward the base portion 12 side.

Specifically, the base portion 12 is formed such that the direction D12 from the proximal end portion 12a toward the distal end portion 12b is substantially parallel to the axial direction of the center axis O of the piezoelectric vibrating piece 4.

In the connections γ and δ to the proximal end portion 12a of the base portion 12, a pair of connecting portions 13 and 14 extend from the proximal end portion 12a of the base portion 12 in directions D13a and D14a of intersecting at an intersection angle θ, which is an acute angle smaller than 90°, with respect to a direction orthogonal to the axial direction of the center axis O. The bent portions 13a and 14a are formed so as to be bent in the directions D13 and D14 orthogonal to the directions D13a and D14a.

A pair of vibrating arm portions 10 and 11 are formed such that, in the connections α and β to a pair of connecting portions 13 and 14, the directions D10 and D11 from the distal end portions 10b and 11b toward the proximal end portions 10a and 11a are orthogonal to the directions D13 and D14 in which the connecting portions 13 and 14 extend from the bent portions 13a and 14a.

Fifth to Ninth Modifications, Piezoelectric Vibrating Piece

In the above-described embodiment and the first to fourth modifications, although the base portion 12 is formed in a rectangular plate shape in which the direction from the proximal end portion 12a toward the distal end portion 12b is parallel to the axial direction of the center axis O, the invention is not limited thereto, and as in fifth to ninth modifications shown in FIGS. 11 to 15, the base portion 12 may be formed in a side shape parallel to a pair of vibrating arm portions 10 and 11 intersecting the axial direction of the center axis O at a predetermined angle.

With these, since the dimension in the width direction of the distal end portion 12b of the base portion 12 is smaller than the dimension in the width direction of the proximal end portion 12a, even when the distal end portions 10b and 11b of the vibrating arm portions 10 and 11 are closer to the center axis O than the proximal end portions 10a and 11a, it is possible to prevent the vibrating arm portions 10 and 11 from coming into contact with the distal end portion 12b of the base portion 12.

Fifth, Sixth, and Seventh Modifications, Piezoelectric Vibrating Piece

Figure 11:
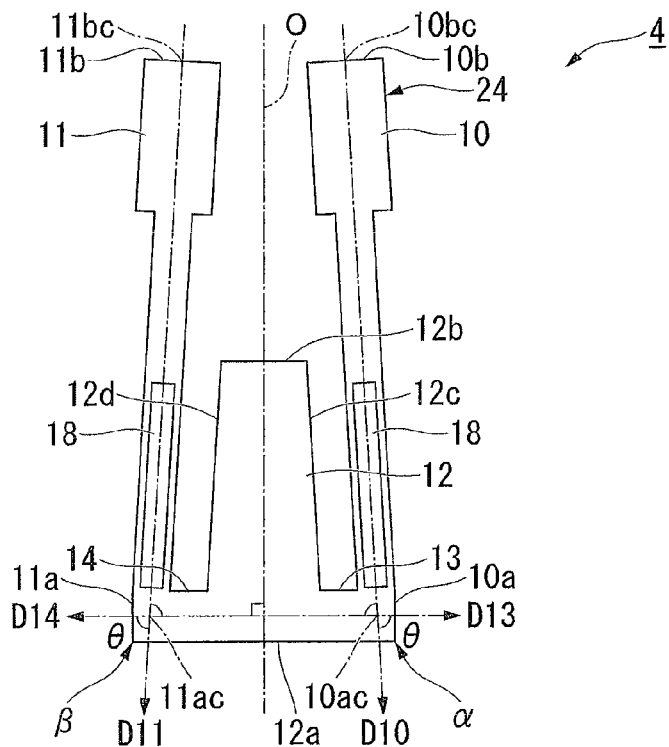
FIG. 11 is a plan view of a piezoelectric vibrating piece according to a fifth modification of the embodiment of the invention.
Figure 12:
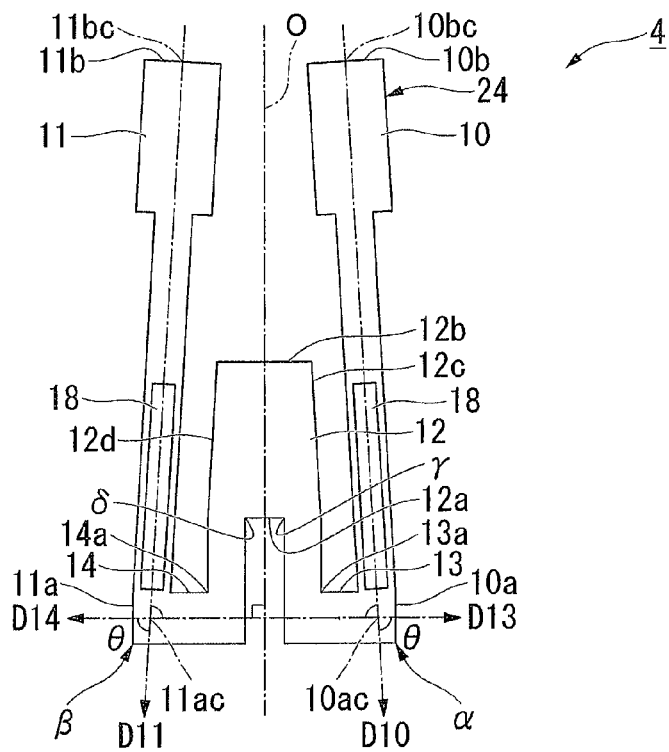
FIG. 12 is a plan view of a piezoelectric vibrating piece according to a sixth modification of the embodiment of the invention.
Figure 13:
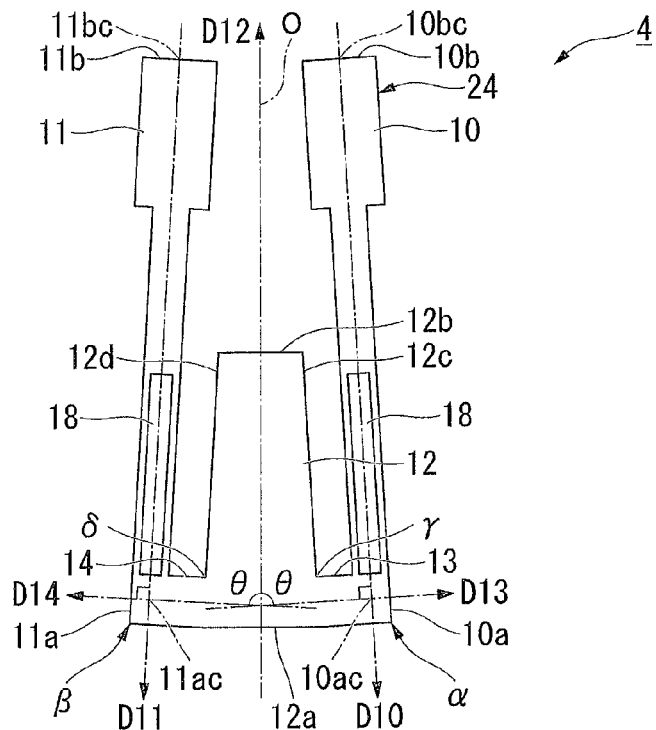
FIG. 13 is a plan view of a piezoelectric vibrating piece according to a seventh modification of the embodiment of the invention.

Compared to the above-described embodiment and the first and second modifications, in the piezoelectric vibrating piece 4 according to each of the fifth to seventh modifications, as shown in FIGS. 11 to 13, in the width direction orthogonal to the axial direction of the center axis O, the dimension in the width direction of the distal end portion 12b of the base portion 12 is smaller than the dimension in the width direction of the proximal end portion 12a of the base portion 12.

Specifically, the base portion 12 is formed in a trapezoidal plate shape in which the distal end portion 12b becomes an upper base and the proximal end portion 12a becomes a lower base, and side portions 12c and 12d corresponding to a pair of opposite sides as the legs of the trapezoidal shape are formed in parallel to the directions D10 and D11 from the distal end portions 10b and 11b of a pair of vibrating arm portions 10 and 11 toward the proximal end portions 10a and 11a.

Eighth Modification, Piezoelectric Vibrating Piece

Figure 14:
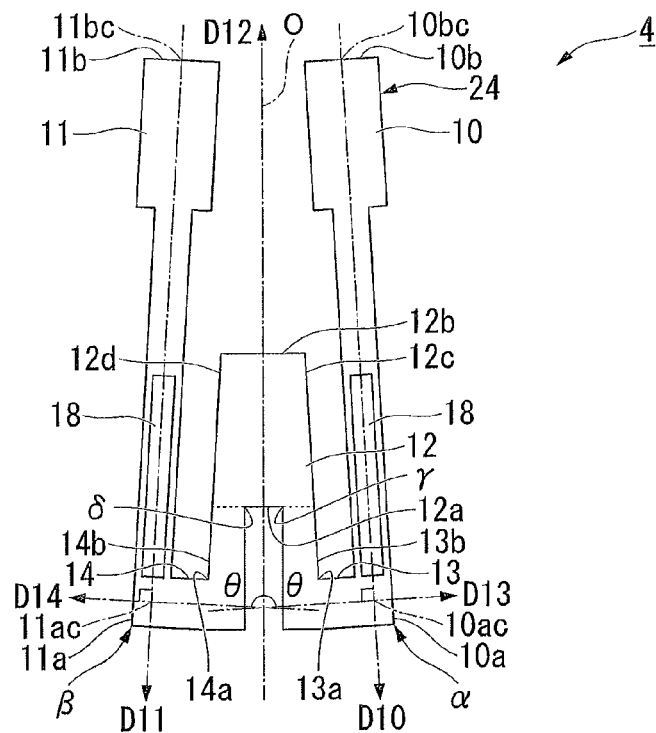
FIG. 14 is a plan view of a piezoelectric vibrating piece according to an eighth modification of the embodiment of the invention.

In the above-described sixth modification, as shown in FIG. 12, although only the side portions 12c and 12d of the base portion 12 are parallel to a pair of vibrating arm portions 10 and 11, the invention is not limited thereto, and as in an eighth modification shown in FIG. 14, a pair of connecting portions 13 and 14 may be provided with portions parallel to a pair of vibrating arm portions 10 and 11.

Compared to the above-described third modification, in the piezoelectric vibrating piece 4 according to the eighth modification, as shown in FIG. 14, the base portion 12 is formed in a trapezoidal plate shape in which the distal end portion 12b becomes an upper base and the proximal end portion 12a becomes a lower base, and the side portions 12c and 12d corresponding to a pair of opposite sides as the legs of the trapezoidal shape are formed in parallel to the directions D10 and D11 from the distal end portions 10b and 11b of a pair of vibrating arm portions 10 and 11 toward the proximal end portions 10a and 11a.

In the connections γ and δ to the proximal end portion 12a of the base portion 12, a pair of connecting portions 13 and 14 extend from the proximal end portion 12a of the base portion 12 in the axial direction of the center axis O. The bent portions 13a and 14a are formed so as to be bent in the directions D13 and D14 of intersecting at the intersection angle θ smaller than 90° by a predetermined angle with respect to the direction D12 from the proximal end portion 12a of the base portion 12 toward the distal end portion 12b.

In the connections γ and δ to the proximal end portion 12a of the base portion 12, a pair of connecting portions 13 and 14 are provided with side portions 13b and 14b which are parallel to the directions D10 and D11 from the distal end portions 10b and 11b of a pair of vibrating arm portions 10 and 11 toward the proximal end portions 10a and 11a so as to continue with the side portions 12c and 12d of the base portion 12.

Ninth Modification, Piezoelectric Vibrating Piece

Figure 15:
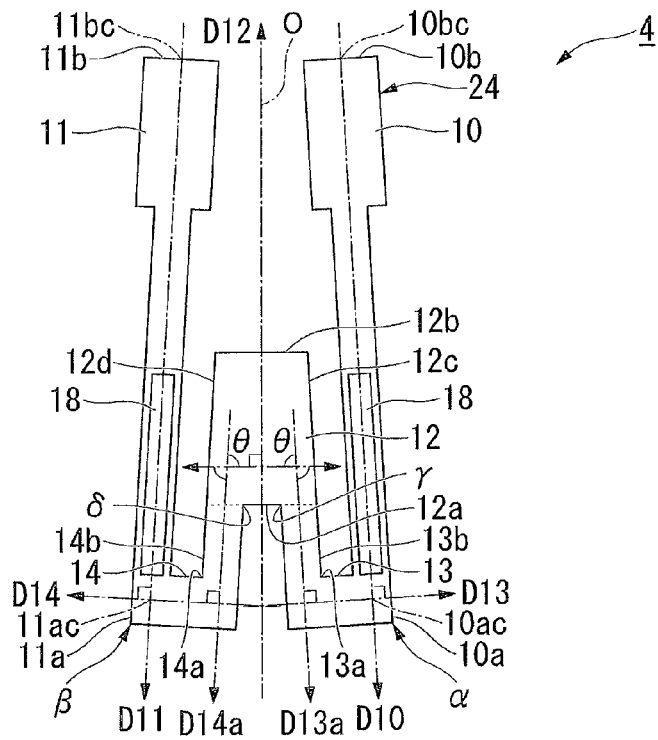
FIG. 15 is a plan view of a piezoelectric vibrating piece according to a ninth modification of the embodiment of the invention.

Compared to the above-described fourth modification, in a piezoelectric vibrating piece 4 according to a ninth modification, as shown in FIG. 15, in the connections γ and δ to the proximal end portion 12a of the base portion 12, a pair of connecting portions 13 and 14 extend in the directions D13a and D14a of intersecting at the intersection angle θ smaller than 90° by a predetermined angle with respect to the direction orthogonal to the axial direction of the center axis O from the proximal end portion 12a of the base portion 12.

Meanwhile, the base portion 12 is formed in a trapezoidal plate shape in which the distal end portion 12b becomes an upper base and the proximal end portion 12a becomes a lower base, and the side portions 12c and 12d corresponding to a pair of opposite sides as the legs of the trapezoidal shape are formed in parallel to the directions D10 and D11 from the distal end portions 10b and 11b of a pair of vibrating arm portions 10 and 11 toward the proximal end portions 10a and 11a.

In the connections γ and δ to the proximal end portion 12a of the base portion 12, a pair of connecting portions 13 and 14 are provided with side portions 13b and 14b which are parallel to the directions D10 and D11 from the distal end portions 10b and 11b of a pair of vibrating arm portions 10 and 11 toward the proximal end portions 10a and 11a so as to continue with the side portions 12c and 12d of the base portion 12.

Tenth Modification, Piezoelectric Vibrating Piece

Figure 16:
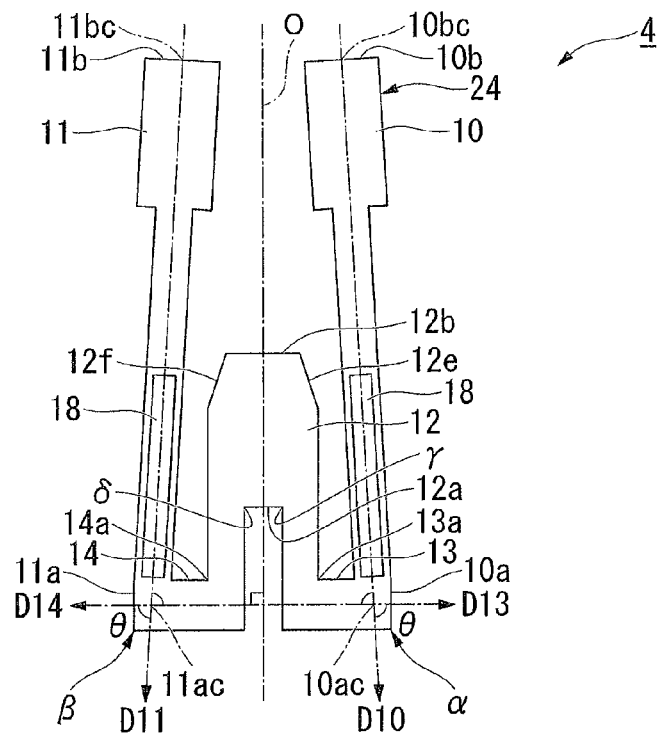
FIG. 16 is a plan view of a piezoelectric vibrating piece according to a tenth modification of the embodiment of the invention.

In the above-described embodiment and the first to fourth modifications, although the base portion 12 is formed in a rectangular plate shape in which the direction from the proximal end portion 12a toward the distal end portion 12b is parallel to the axial direction of the center axis O, the invention is not limited thereto, and as in a tenth modification shown in FIG. 16, the base portions 12 may be formed such that the distal end portion 12b has a chamfered shape.

Compared to the above-described first modification, in the piezoelectric vibrating piece 4 according to the tenth modification, as shown in FIG. 16, the base portion 12 is provided with chamfered shapes 12e and 12f in the end portions in the width direction of the distal end portion 12b. According to the tenth modification, it is possible to prevent the vibrating arm portions 10 and 11 from coming into contact with the distal end portion 12b of the base portion 12 while suppressing a decrease in area of the base portion 12.

Oscillator

Next, an embodiment of an oscillator according to the invention will be described.

Figure 17:
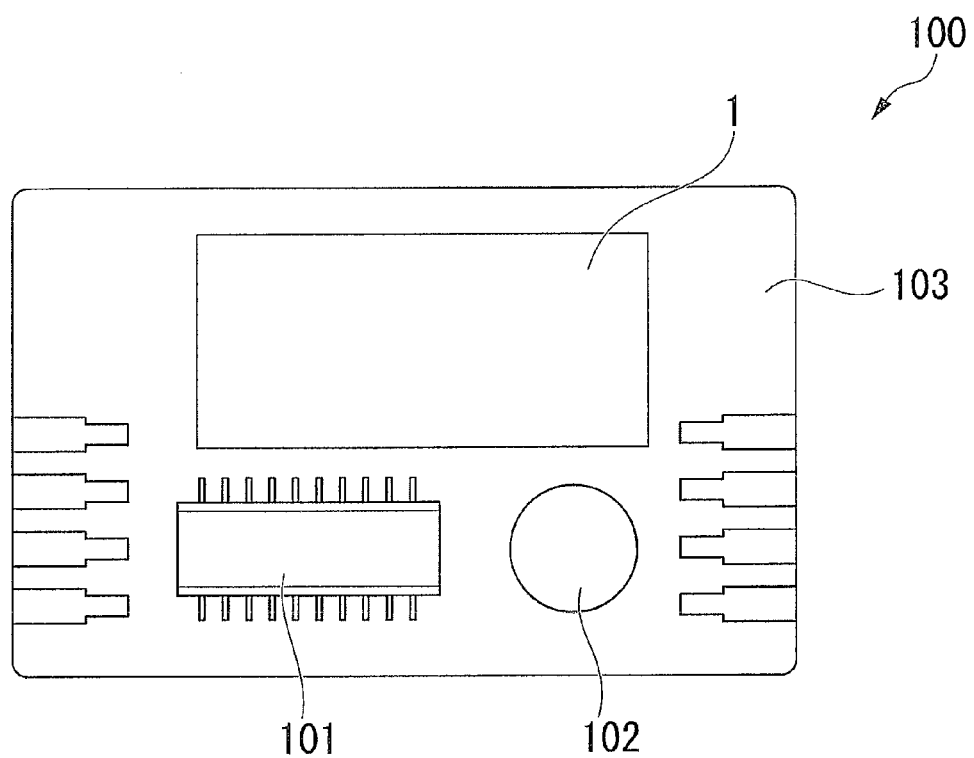
FIG. 17 is a configuration diagram showing an embodiment of an oscillator according to the invention.

As shown in FIG. 17, an oscillator 100 of this embodiment is configured with the piezoelectric vibrator 1 as an oscillating piece electrically connected to an integrated circuit 101.

The oscillator 100 includes, on a substrate 103, the above-described integrated circuit 101 for an oscillator, an electronic component 102, such as a capacitor, and the piezoelectric vibrating piece 4 of the piezoelectric vibrator 1 arranged near the integrated circuit 101.

The electronic component 102, the integrated circuit 101, and the piezoelectric vibrator 1 are electrically connected together by a wiring pattern (not shown).

Each of the constituent components is molded by resin (not shown).

In the oscillator 100 configured as above, if a voltage is applied to the piezoelectric vibrator 1, the piezoelectric vibrating piece 4 inside the piezoelectric vibrator 1 vibrates. This vibration is converted to an electrical signal by the piezoelectric characteristic of the piezoelectric vibrating piece 4, and is input to the integrated circuit 101 as the electrical signal. The input electrical signal is subjected to various processes by the integrated circuit 101 and then output as a frequency signal. Accordingly, the piezoelectric vibrator 1 functions as an oscillating piece.

The configuration of the integrated circuit 101 with a real time clock (RTC) module or the like is selectively set as required, whereby it is possible to apply a function of controlling an operation date or time of the apparatus and an external apparatus in addition to a single-function oscillator for a timepiece and the like, or providing time, a calendar, or the like.

As described above, according to the oscillator 100 of this embodiment, since the above-described piezoelectric vibrator 1 is provided, it is possible to provide the oscillator 100 which can obtain high quality with excellent characteristics and reliability.

In addition, it is possible to obtain a stable frequency signal with high precision for a long period.

Electronic Apparatus

Next, an embodiment of an electronic apparatus according to the invention will be described.

As the electronic apparatus, a mobile information apparatus 110 having the above-described piezoelectric vibrator 1 will be described as an example.

The mobile information apparatus 110 of this embodiment is represented by, for example, a mobile phone, and is obtained by developing and improving a watch of the related art. The appearance is similar to a watch, and it is possible to arrange a liquid crystal display in a portion corresponding to a dial plate and to display current time or the like on the screen.

When being used as a communication instrument, it is possible to perform the same communication as a mobile phone of the related art with a speaker and a microphone embedded in an inner side portion of a band by taking the mobile information apparatus from the wrist. However, the mobile information apparatus is significantly reduced in size and weight compared to the mobile phone of the related art.

Mobile Information Apparatus

Next, the configuration of the mobile information apparatus 110 of this embodiment will be described.

Figure 18:
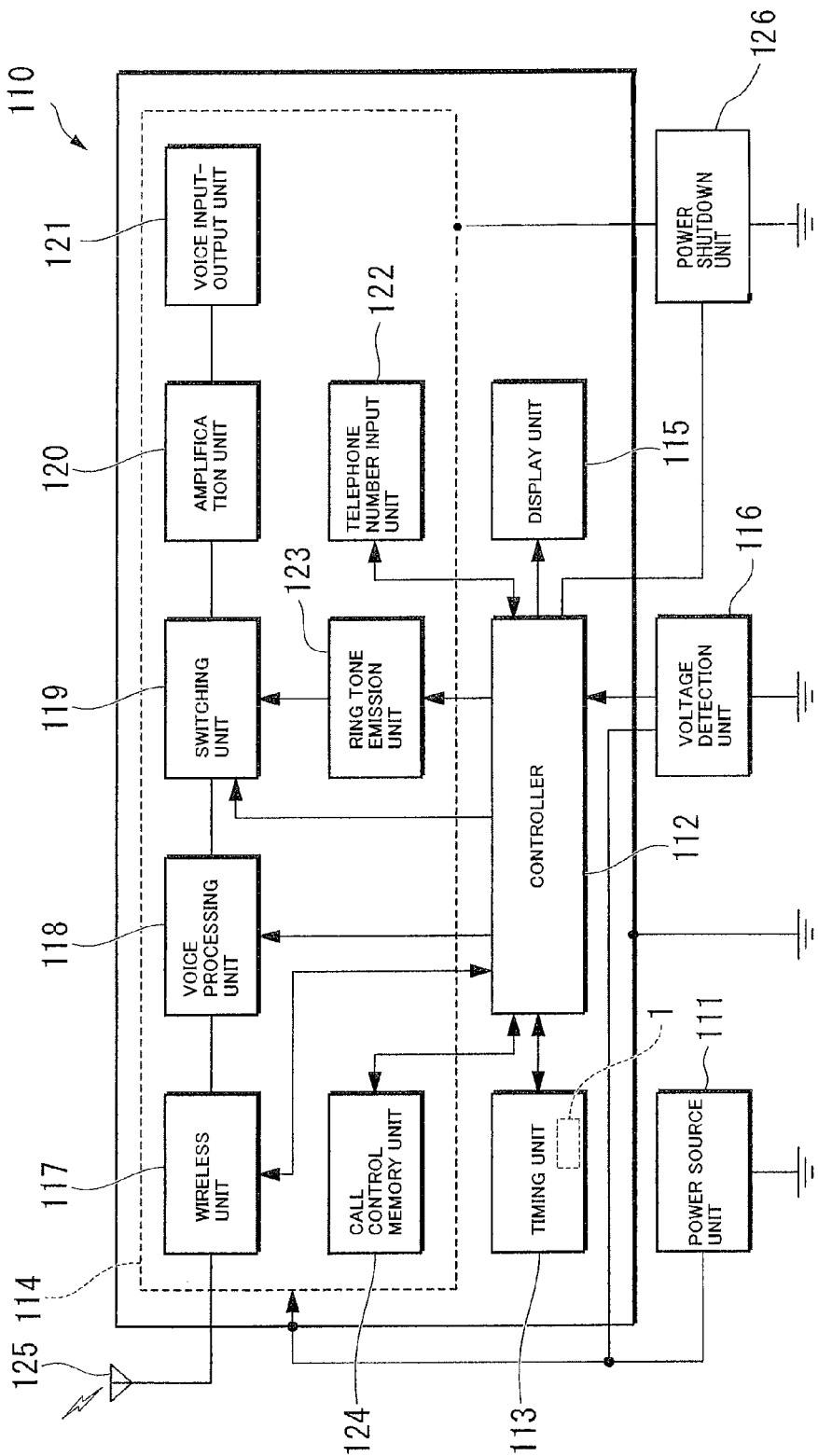
FIG. 18 is a configuration diagram showing an embodiment of an electronic apparatus according to the invention.

As shown in FIG. 18, the mobile information apparatus 110 includes the piezoelectric vibrator 1, and a power supply unit 111 which supplies power.

The power supply unit 111 is constituted by, for example, a lithium secondary battery.

A control unit 112 which performs various kinds of control, a counter unit 113 which counts time or the like, a communication unit 114 which performs communication with the outside, a display unit 115 which displays various kinds of information, and a voltage detection unit 116 which detects a voltage of each functional unit are connected in parallel to the power supply unit 111.

Power is supplied from the power supply unit 111 to each functional unit.

The control unit 112 controls each functional unit to perform operation control of the entire system, such as transmission and reception of voice data, measurement or display of the current time, and the like.

The control unit 112 includes a ROM in which a program is written in advance, a CPU which reads and executes the program written in the ROM, a ROM which is used as a work area of the CPU, and the like.

The counter unit 113 includes an integrated circuit in which an oscillation circuit, a register circuit, a counter circuit, an interface circuit, and the like are embedded, and the piezoelectric vibrator 1.

If a voltage is applied to the piezoelectric vibrator 1, the piezoelectric vibrating piece 4 vibrates, and this vibration is converted to an electrical signal by the piezoelectric characteristic inherent in crystal and input to the oscillation circuit as the electrical signal. The output of the oscillation circuit is binarized and counted by the register circuit and the counter circuit.

The transmission and reception of the signal to and from the control unit 112 is performed through the interface circuit, and the current time or current date, calendar information, and the like are displayed on the display unit 115.

The communication unit 114 has the same function as the mobile phone of the related art, and includes a wireless unit 117, a voice processing unit 118, a switching unit 119, an amplification unit 120, a voice input/output unit 121, a telephone number input unit 122, a ringtone generation unit 123, and a call control memory unit 124.

The wireless unit 117 performs the transmission and reception of various kinds of data, such as voice data, to and from a base station through an antenna 125.

The voice processing unit 118 encodes and decodes a voice signal input from the wireless unit 117 or the amplification unit 120.

The amplification unit 120 amplifies a signal input from the voice processing unit 118 or the voice input/output unit 121 to a predetermined level.

The voice input/output unit 121 has a speaker, a microphone, and the like, and amplifies a ringtone or voice from a receiver or collects voice.

The ringtone generation unit 123 generates a ringtone according to a call from the base station. The switching unit 119 switches the amplification unit 120, which is connected to the voice processing unit 118, to the ringtone generation unit 123 only when receiving a call, and the ringtone generated in the ringtone generation unit 123 is output to the voice input/output unit 121 through the amplification unit 120.

The call control memory unit 124 stores a program regarding outgoing/incoming call control of communication. The telephone number input unit 122 includes, for example, numeric keypads from 0 to 9 and other keypads, and the numeric keypads and the like are pressed to input the phone number of the called party, or the like.

When the voltage which is applied to each functional unit, such as the control unit 112, by the power supply unit 111 falls below a predetermined value, the voltage detection unit 116 detects the voltage drop and gives notification to the control unit 112. The predetermined voltage value at this time is a value which is set in advance as a minimum voltage necessary for stably operating the communication unit 114, and becomes, for example, about 3 V.

The control unit 112 which is given notification of the voltage drop from the voltage detection unit 116 inhibits the operations of the wireless unit 117, the voice processing unit 118, the switching unit 119, and the ringtone generation unit 123. In particular, it is necessary to inhibit the operation of the wireless unit 117 which has high power consumption. The display unit 115 displays the effect that the communication unit 114 cannot function due to a low remaining battery level.

That is, the voltage detection unit 116 and the control unit 112 can inhibit the operation of the communication unit 114 and can display the effect on the display unit 115. The display may be a text message or may be an x mark on a phone icon displayed on an upper portion of the display surface of the display unit 115 as further intuitive display.

The power supply shutoff unit 126 which can selectively shut off the power supply of a portion regarding the function of the communication unit 114 is provided, thereby reliably stopping the function of the communication unit 114.

As described above, according to the mobile information apparatus 110 of this embodiment, since the above-described piezoelectric vibrator 1 is provided, it is possible to provide the mobile information apparatus 110 which can obtain high quality with excellent characteristics and reliability. In addition, the mobile information apparatus 110 can display stable timepiece information with high precision for a long period.

Radio-Controlled Timepiece

Next, an embodiment of a radio-controlled timepiece according to the invention will be described referring to FIG. 19.

Figure 19:
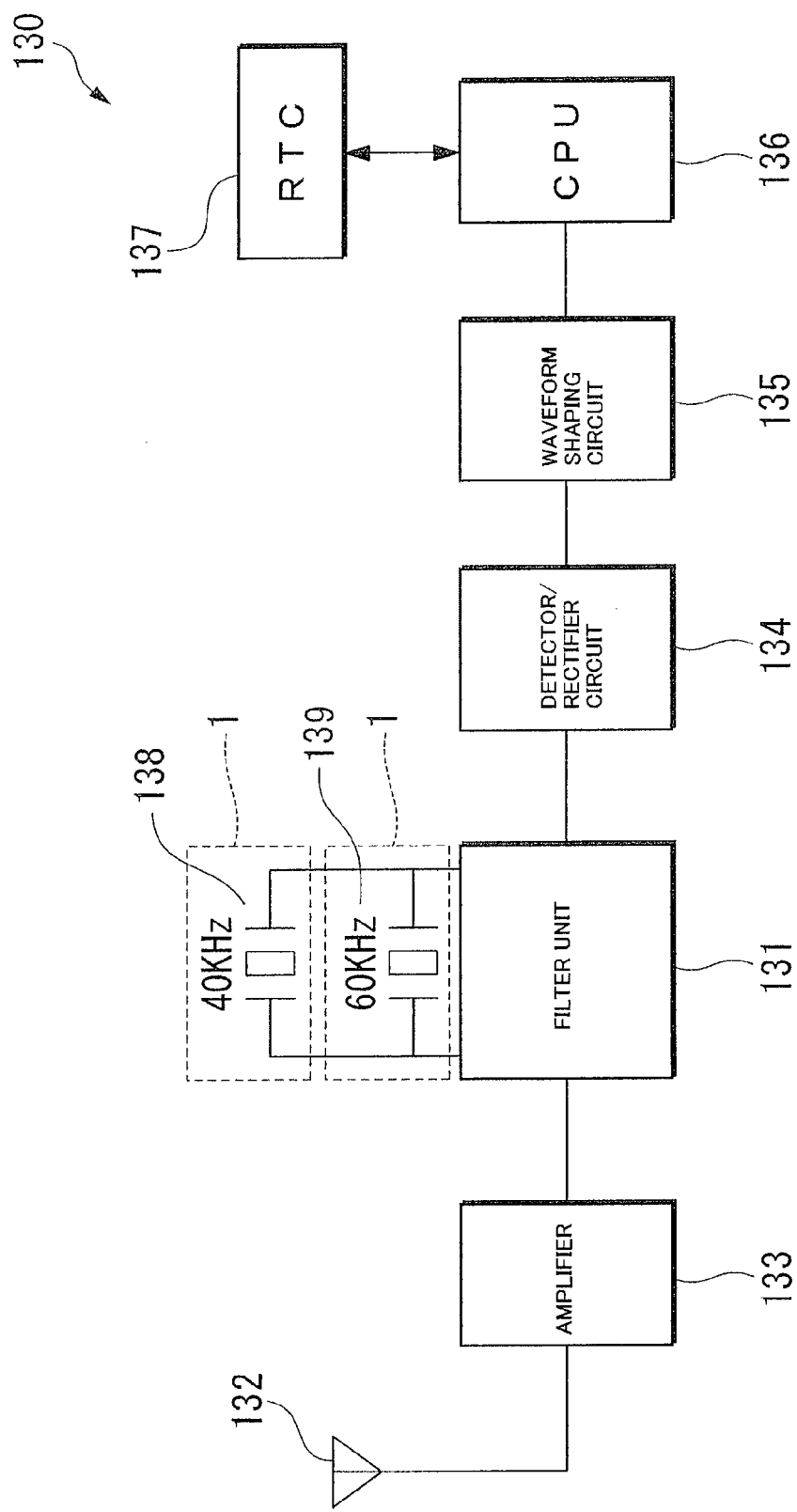
FIG. 19 is a configuration diagram showing an embodiment of a radio-controlled timepiece according to the invention.

As shown in FIG. 19, a radio-controlled timepiece 130 of this embodiment includes the piezoelectric vibrator 1 which is electrically connected to a filter unit 131, and is a timepiece which includes a function of receiving standard radio waves including timepiece information and automatically correcting and displaying accurate time.

Transmitting stations (transmitter stations) which transmit the standard radio waves are in Fukushima-ken (40 kHz) and Saga-ken (60 kHz) in Japan, and respectively transmit the standard radio waves. Since long waves, such as 40 kHz or 60 kHz, have both a property of ground-wave propagation and a property of propagation by reflection between the ionosphere and the ground, a propagation range is large and the above-described two transmitting stations provide full coverage of Japan.

Hereinafter, the functional configuration of the radio-controlled timepiece 130 will be described in detail.

An antenna 132 receives a standard long wave of 40 kHz or 60 kHz. The standard long wave is obtained by applying time information, called a time code, to a carrier wave of 40 kHz or 60 kHz through AM modulation. The received standard long wave is amplified by an amplifier 133 and is filtered and synchronized by the filter unit 131 having a plurality of piezoelectric vibrators 1.

In this embodiment, the piezoelectric vibrator 1 includes crystal vibrator units 138 and 139 which have resonance frequencies of 40 kHz and 60 kHz the same as the above-described carrier frequency.

The filtered signal of the predetermined frequency is detected and demodulated by a detection and rectification circuit 134. Then, the time code is extracted through the waveform shaping circuit 135 and counted in a CPU 136.

The CPU 136 reads information regarding the current year, date, day, time, and the like. The read information is reflected in the RTC 137, and accurate time information is displayed.

Since the carrier wave is 40 kHz or 60 kHz, the vibrator having a tuning fork type structure described above is suitable for the crystal vibrator units 138 and 139.

Although the above description is described with Japan as an example, the frequency of the standard long wave differs by country. For example, the standard radio wave of 77.5 KHz is used in Germany. Accordingly, when the radio-controlled timepiece 130 which can be used overseas is embedded in a mobile apparatus, another piezoelectric vibrator 1 with a frequency different from that in Japan is required.

As described above, according to the radio-controlled timepiece 130 of this embodiment, since the above-described piezoelectric vibrator 1 is provided, it is possible to provide the radio-controlled timepiece 130 which can obtain high quality with excellent characteristics and reliability. In addition, the radio-controlled timepiece 130 can stably count time with high precision for a long period.

The technical scope of the invention is not limited to the above-described embodiment, and various changes may be made within a range without departing from the spirit of the invention.

For example, in the above-described embodiment, although the piezoelectric vibrating piece 4 of the invention is used in the surface mounting type piezoelectric vibrator 1, the invention is not limited thereto, and for example, a known ceramic package type piezoelectric vibrator or a surface mounting type vibrator which is obtained by fixing a cylinder package type piezoelectric vibrator using a mold resin portion may be used.

What is claimed is:
1. A piezoelectric vibrating piece comprising:
a pair of vibrating arm portions;
a base portion between the pair of vibrating arm portions, and
connecting portions connecting proximal end portions of the vibrating arm portions and the proximal end portion of the base portion,
wherein the vibrating arm portions are inclined toward the base portion side and a longitudinal centerline of the connecting portions and a longitudinal center line of the vibrating arm portions intersect at a substantially right angle.
2. The piezoelectric vibrating piece of claim 1, wherein an intersection angle of a center line of the base portion extending along a center axis and the centerline of the connecting portions is smaller than 90 degrees.
3. The piezoelectric vibrating piece of claim 1, wherein the connecting portions are generally L-shaped and extend from the proximal end portion of the base portion.
4. The piezoelectric vibrating piece of claim 1, wherein the distal end portion of the base portion has a chamfered corner.
5. A piezoelectric vibrator comprising the piezoelectric vibrating piece of claim 1 sealed airtight in a package.
6. An oscillator comprising the piezoelectric vibrator of claim 5 electrically connected to an integrated circuit.

7. An electronic apparatus comprising the piezoelectric vibrator of claim 5 electrically connected to a counter unit.

8. A radio-controlled timepiece comprising the piezoelectric vibrator of claim 5 electrically connected to a filter unit.

9. The piezoelectric vibrating piece of claim 1, wherein terminal end sides of the vibrating arm portions and the centerline of corresponding connecting portions extend in parallel directions.

10. A piezoelectric vibrator comprising:
- a support substrate having first and second lead out electrodes thereon and sequentially extending along a center line, each of the first and second lead out electrodes extending between a through electrode and a support having a bump thereon;
- a pair of vibrating arm portions;
- a base portion between the pair of vibrating arm portions and bonded to the support portion of the first and second lead out electrodes; and
- connecting portions connecting proximal end portions of the vibrating arm portions and the proximal end portion of the base portion,
- wherein the vibrating arm portions are inclined toward the base portion side.

\* \* \* \* \*